(12) United States Patent
Snyder

(10) Patent No.: US 7,391,293 B2
(45) Date of Patent: Jun. 24, 2008

(54) TRANSFORMER AND ASSOCIATED METHOD OF MAKING USING LIQUID CRYSTAL POLYMER (LCP) MATERIAL

(75) Inventor: Steven R. Snyder, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 11/838,921

(22) Filed: Aug. 15, 2007

(65) Prior Publication Data

US 2008/0007383 A1    Jan. 10, 2008

Related U.S. Application Data

(62) Division of application No. 11/428,963, filed on Jul. 6, 2006, now Pat. No. 7,340,825.

(51) Int. Cl.
*H01F 5/00* (2006.01)

(52) U.S. Cl. .................. 336/200; 336/223; 336/232

(58) Field of Classification Search .......... 336/200, 336/223, 232
See application file for complete search history.

(56) References Cited

U.S. PATENT DOCUMENTS

| | | | |
|---|---|---|---|
| 3,614,554 A | 10/1971 | Shield et al. ............. 257/531 |
| 3,659,240 A | 4/1972 | Learned et al. .......... 336/200 |
| 4,708,976 A | 11/1987 | Ryan ....................... 523/300 |
| 4,876,120 A | 10/1989 | Belke ......................... 428/1 |
| 5,312,674 A | 5/1994 | Haertling et al. .......... 428/210 |
| 5,349,743 A | 9/1994 | Grader et al. ............ 29/602.1 |
| 5,532,667 A | 7/1996 | Haertling et al. .......... 336/177 |
| 5,802,702 A | 9/1998 | Fleming et al. ............ 29/608 |
| 6,007,758 A | 12/1999 | Fleming et al. ........... 264/429 |
| 6,153,078 A | 11/2000 | Fleming et al. ........... 205/119 |
| 6,462,976 B1 | 10/2002 | Olejniczak et al. ........ 363/147 |
| 6,933,596 B2 | 8/2005 | Hathaway et al. ......... 257/678 |
| 6,990,729 B2 | 1/2006 | Pleskach et al. ............ 29/606 |
| 2003/0222340 A1 | 12/2003 | Kondo et al. .............. 257/700 |
| 2004/0211954 A1* | 10/2004 | Wu et al. .................... 257/10 |
| 2004/0212475 A1 | 10/2004 | Schumacher .............. 336/200 |
| 2006/0075931 A1 | 4/2006 | Utagaki et al. ............ 106/677 |
| 2006/0180342 A1* | 8/2006 | Takaya et al. ............. 174/256 |
| 2007/0001796 A1* | 1/2007 | Waffenschmidt et al. .. 336/223 |
| 2007/0139976 A1* | 6/2007 | deRochemont ............ 363/17 |

FOREIGN PATENT DOCUMENTS

| | | |
|---|---|---|
| EP | 0564019 | 10/1993 |
| EP | 0936637 | 8/1999 |
| EP | 1610599 | 12/2005 |
| JP | 02027791 A | 1/1990 |
| WO | 96/08945 | 3/1996 |
| WO | 2005084090 | 9/2005 |

\* cited by examiner

*Primary Examiner*—Anh T Mai
(74) *Attorney, Agent, or Firm*—Allen, Dyer, Doppelt, Milbrath & Gilchrist, P.A.

(57) ABSTRACT

A transformer and method of making includes first half primary and secondary windings as metallic circuits that are etched on a metallic cladding of a first liquid crystal polymer (LCP) sheet. Secondary windings are positioned in spaced relation to the primary windings. A second LCP sheet is applied over the first LCP sheet. Second half primary and secondary windings are etched as metallic circuits on a metallic cladding of a second LCP sheet. Respective first and second half primary windings are interconnected to each other and the first and second half secondary windings are connected to each other by conductive vias.

9 Claims, 9 Drawing Sheets

TRANSFORMER AND ASSOCIATED METHOD OF MAKING USING LIQUID CRYSTAL POLYMER (LCP) MATERIAL

RELATED APPLICATION

This application is a divisional of Ser. No. 11/428,963 filed on Jul. 6, 2006, now U.S. Pat. No. 7,340,825 the disclosure of which is hereby incorporated by reference in its entirety.

FIELD OF THE INVENTION

The present invention relates to the field of transformers, and more particularly, to making a transformer using ceramic, ferrite or liquid crystal polymer materials.

BACKGROUND OF THE INVENTION

Miniature, low cost, small-signal transformers for impedance matching and conversion of single-ended to differential (BALUNS) are sometimes prohibitively large for portable designs using standard wire-wound core technology. Some advances in low temperature co-fired ceramic ferrite tapes and pastes allow fabrication alternatives to wire-wound cores. For example, some fabrication processes for a transformer structure or similar device use metallized magnetic substrates or green tape processes, such as disclosed in U.S. Pat. Nos. 6,007,758 and 5,802,702. For example, vias can be formed through a ceramic body and sidewalls coated with a conductive material. An aperture can be formed through the ceramic body and intersect the via. The unfired ceramic body can be metallized such that a conductive pathway is formed. Also, some devices can be formed from multiple unfired ferrite layers a single via coating step, permitting green tape-type fabrication.

Other processes use traditional low temperature co-fired ceramic (LTCC) and ferrite tape/ink combinations, such as disclosed in U.S. Pat. Nos. 5,312,674 and 5,532,667. For example, a ferromagnetic material can be provided in ink or tape form and sinterable, using a firing profile that is about the same thermal shrinkage characteristics as low temperature co-fired ceramic tape.

Other magnetic components can be fabricated as monolithic structures using multilayer co-fired ceramic tape techniques such as disclosed in U.S. Pat. No. 5,349,743. Multiple layers of a magnetic material and an insulating non-magnetic material can form a monolithic structure having magnetic and insulating non-magnetic regions. Windings can be formed using screen-printed conductors connected through the multilayer structure by conducting vias.

Improvements are still desired to ensure that traditional thick film printing and commercially available multilayered ceramic (ferrite) tape processing can be used with silver and gold thick film conductors without wire winding. It is desirable that small designs be implemented for high frequency, small-signal applications having a low profile. Flexible designs are desirable that allow the conductor and core to be integrated. A minimum number of layers is desired with a simple pattern to provide a tightly coupled interaction between primary and secondary windings.

SUMMARY OF THE INVENTION

A transformer and method of making includes first half primary and secondary windings as metallic circuits that are etched on a metallic cladding of a first liquid crystal polymer (LCP) sheet such that secondary windings are positioned in spaced relation to the primary windings. A second LCP sheet is applied over the first LCP sheet. Second half primary and secondary windings are etched as metallic circuits on a metallic cladding of the second LCP sheet. Respective first and second half primary windings are interconnected to each other and the first and second half secondary windings are connected to each other by conductive vias.

The conductive vias can be formed as plated through-holes or punched holes that are filled with a conductive fill material.

In yet another aspect, the first and second LCP sheets can be fused together within an autoclave. The first and second LCP sheets can be biaxially oriented. Ferrite fillers can be provided within at least one of the first and second LCP sheets. A ferrite layer can be added between first and second LCP sheets.

In another aspect, the LCP sheets can be between about 25 micrometers to about 3 millimeters thick. The metallic cladding can be formed as a copper cladding in one non-limiting example.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art. Like numbers refer to like elements throughout.

In accordance with non-limiting examples described throughout this description, the transformer and method of making as described allows the use of traditional thick film printing and commercially available multilayer ceramic (ferrite) tape processing that can be co-fired with metallic thick film conductors, for example, silver or gold as non-limiting examples. No wire winding is required and small designs are possible for high frequency, small-signal applications. The transformer has a low profile for volume efficient designs that are more flexible because the conductor and core are integrated. The transformer design as described can use simple patterns and a minimum number of layers that provide tightly coupled interaction between primary and secondary windings. It is also possible to use liquid crystal polymer (LCP) sheets to manufacture the transformer in accordance with non-limiting examples of the present invention.

The transformer can be adapted for use with radio frequency (RF) and intermediate frequency (IF) circuits and miniaturized for problematic and common components. The transformer can use materials that are commercially available and be manufactured using a commercially available process. This transformer structure, in accordance with a non-limiting example of the present invention, has a broad applicability in the commodity transformer market and in portable wireless designs. It can be especially relevant to many S-band receiver designs.

For purposes of description, there follows a brief description of various prior art designs, followed by non-limiting examples of a transformer and method of making same in accordance with a non-limiting example of the present invention.

Figure 1:
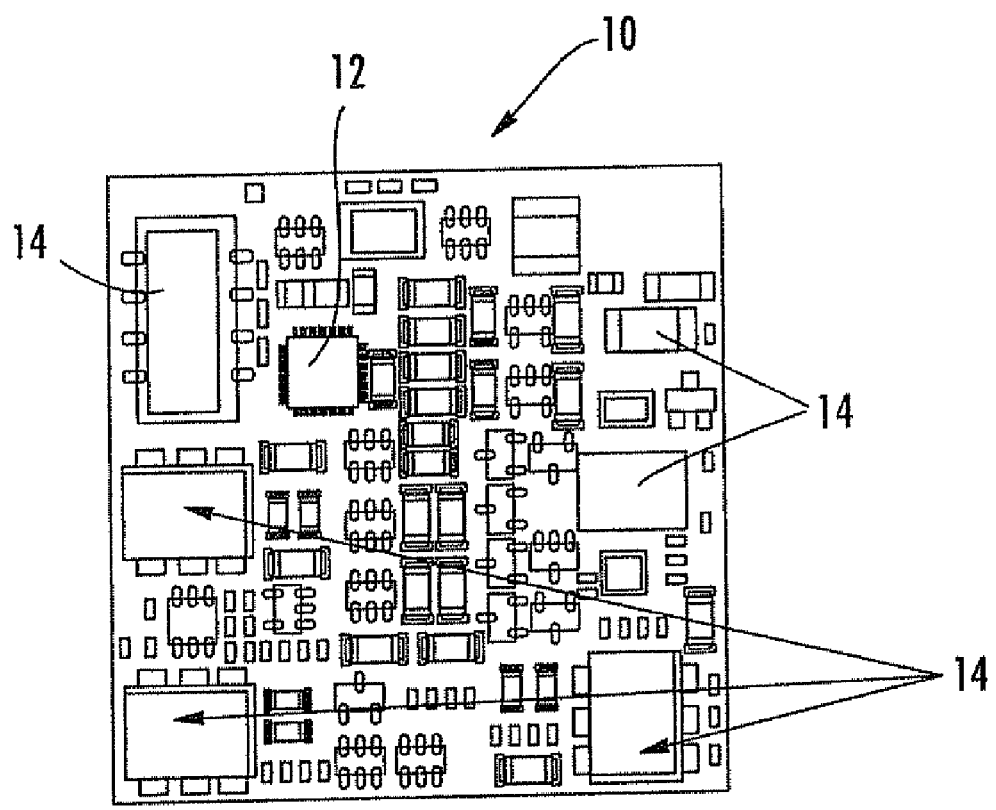
FIG. 1 is a plan view of a prior art circuit board showing various electronic components and three "small" transformers as mini-circuits that are formed using standard designs and showing the large profile of such prior art transformers.

FIG. 1 shows a plan view of circuit board 10 having numerous electronic components mounted thereon, including integrated circuits (IC's) 12 and numerous other electronic components 14. Three "small" transformers 16 as mini-circuits are mounted on the circuit board 10. These prior art transformers can be formed using standard wire-wound core technology. These types of prior art transformers 16 have a high profile and large footprint. In some instances, the prior art transformers 16 extend vertically a greater distance than many of the other components 12,14 that are illustrated and mounted on the circuit board 10.

Figure 2:
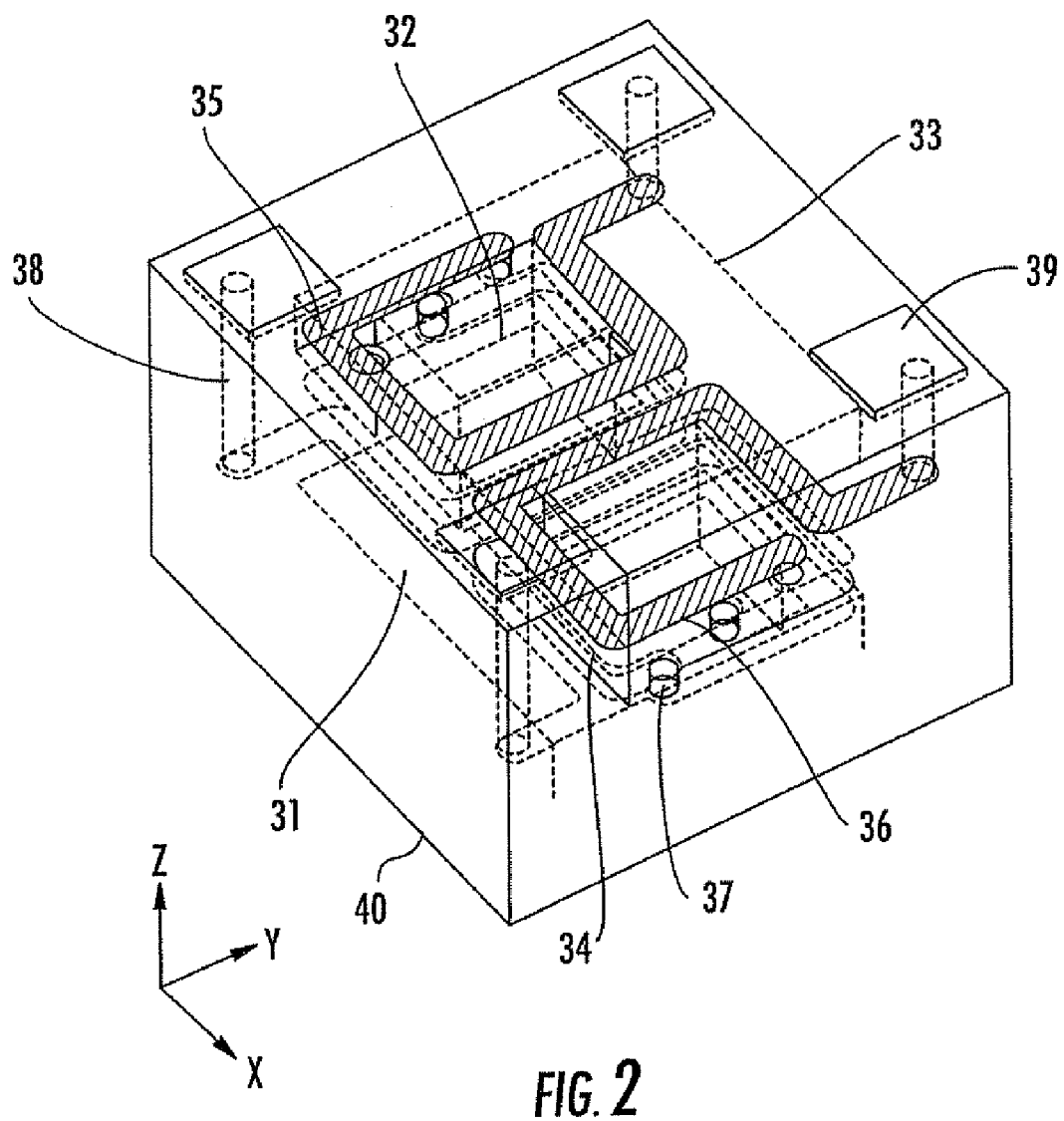
FIG. 2 is an isometric, partial phantom drawing view of a prior art composite magnetic component structure.
Figure 3:
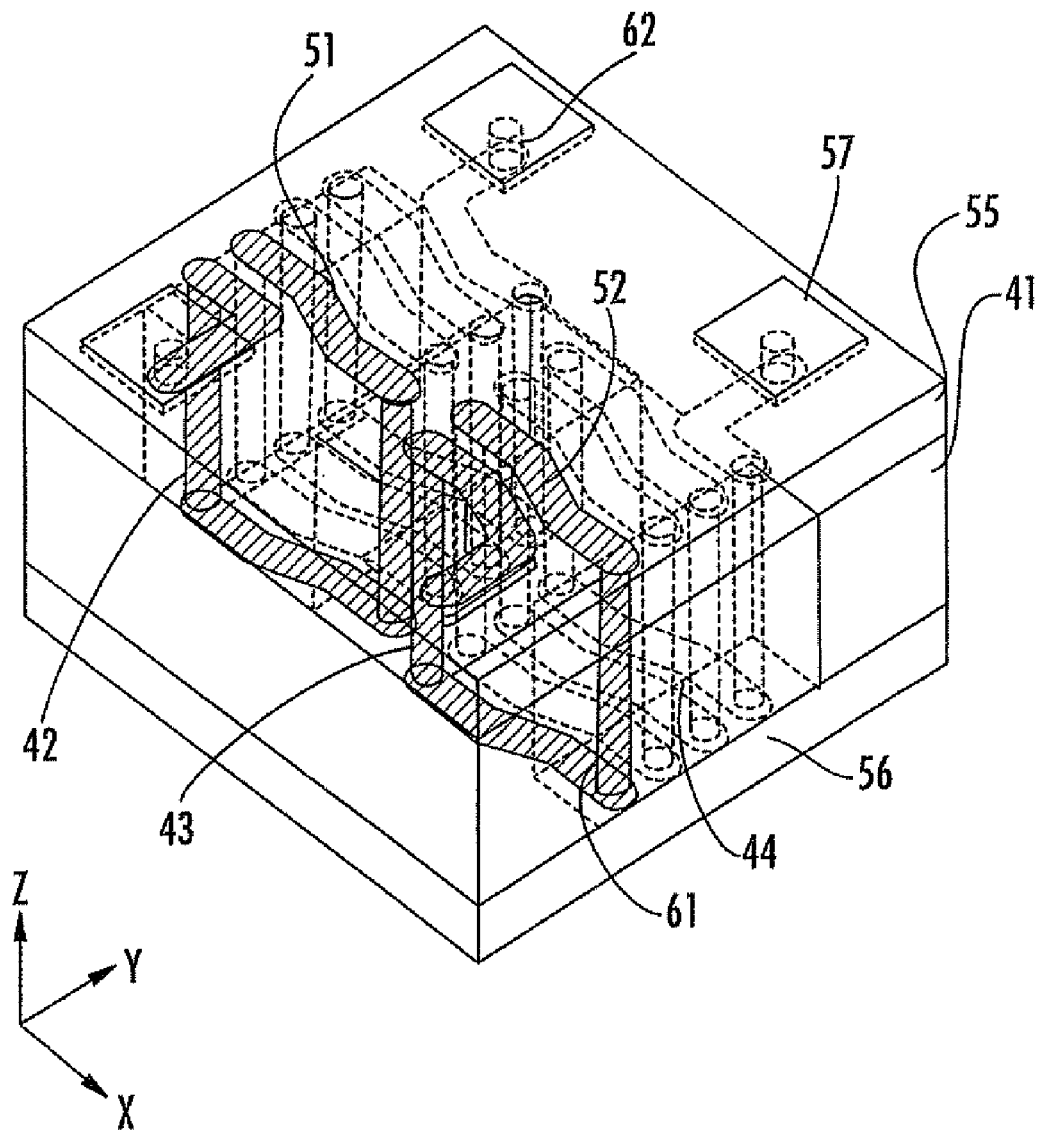
FIG. 3 is another isometric drawing of a prior art composite magnetic component structure similar to that shown in FIG. 2, but showing a different orientation of internal components.

Another prior art monolithic structure uses multilayer co-fired ceramic tape techniques and examples are shown in FIGS. 2 and 3. The fabrication of these magnetic components, such as transformers, uses multiple layers of magnetic material and insulates the non-magnetic material to form a monolithic structure with well-defined magnetic and insulating non-magnetic regions. Windings can be formed using screen-printed conductors connected through the multilayer structure by conducting vias.

It should be understood that co-fired multilayer construction has been found to be increasingly competitive with the traditional thick film technology in the fabrication of microelectronic circuit packages. Co-fired multilayer packages can be constructed with unfired green (dielectric) ceramic tape for the various layers. Compatible conductive compositions can use printed conductor layers interspersed between the dielectric layers, and interlayer connecting vias. The conductive layers are normally printed on the green tape, and the entire assembly is laminated and fired in one operation. It can reduce the physical size of circuitry and improve its reliability.

The prior art examples shown in FIGS. 2 and 3 are explained in U.S. Pat. No. 5,349,743. Pluralities of the two ceramic green tape materials are layered with a desired geometry to form a laminated structure with well-defined magnetic and non-magnetic regions. Conducting paths are deposited on selected insulating nonmagnetic tape layers. These conducting paths are connected by vias formed in the layers to create desired multi-turn windings for the magnetic component.

The conducting paths can be constructed of a conductive material that is amenable to printing or other deposition techniques, and is compatible with the firing and sintering process characteristics of ferrite materials. Suitable conductive materials include palladium (Pd) or palladium-silver compositions (Pd—Ag) dispersed in an organic binder. Other suitable compositions include conductive metallic oxides (in a binder), which have the same firing and sintering characteristics as the ferrite materials used in constructing the magnetic devices.

The structure formed by the layering technique is laminated under pressure and co-fired and sintered at a temperature of 1100 to 1400 degrees Centigrade to form a monolithic magnetic component structure having the desired electrical and magnetic properties.

To increase electrical resistivity and further reduce the low permeability of the second tape material, the Ni ferrite powder material is doped with Mn to a content equaling 1-10 mol % of the overall material composition.

The component shown in FIG. 2 is constructed as a multiple winding transformer having a toroidal magnetic core structure. This toroidal core has four well-defined sections 31-34, each of which is constructed from a plurality of high permeability ceramic green tape layers. Sections 32 and 34 are circumscribed by conductive windings 35 and 36, respectively. Taken separately these windings form the primary and secondary windings of a transformer. If these windings are connected in series, however, the structure functions as a multiple turn inductor. Windings 35 and 36 can be formed by screen-printing pairs of conductor turns onto a plurality of insulating non-magnetic ceramic green tape layers. Each insulating non-magnetic layer can have suitable apertures for containing the sections of magnetic green tape layered inserts.

The turns printed on each layer are connected to turns of the other layers with conductive vias 37, i.e., a through hole filled with a conductive material. Additional insulating non-magnetic layers are used to contain sections 31 and 33 of the magnetic tape sections and to form the top and bottom structure of the component. Conductive vias 38 are used to connect the ends of the windings 35 and 36 to connector pads 39 on the top surface of the component. The insulating non-magnetic regions of the structure are denoted by 40. Current excitation of the windings 35 and 36 produces a magnetic flux in the closed magnetic path defined by the sections 31-34 of the toroidal core. The fluxpath in this embodiment is in a vertical plane, e.g., the x-z plane shown in FIG. 3.

A phantom view of another prior art magnetic component is shown in FIG. 3. This component, as in the case with the prior example, is also constructed as a multiple winding transformer having a toroidal magnetic core structure. A major difference from the embodiment of FIG. 2 is that the flux path is horizontal, i.e., in the X-Y plane. The toroidal core is defined by a main structure of magnetic material 41 positioned between top and bottom members 55 and 56, which are insulating non-magnetic material layers. Member 41 is further punctuated by inserts of insulating non-magnetic material inserts 42, 43, and 44, which provide support for conducting vias 61, which form part of the windings. The windings 51 and 52 are the primary and secondary, respectively, of the transformer. Windings 51 and 52 may be connected in series to form an inductor. These windings are formed by screen printing conductors on a layer of member 55 near the top of the structure and screen printing conductors on a layer of member 56 near the bottom of the structure and interconnecting these printed conductors with the conducting vias 61 to form the windings. Connector pads 57 are printed on the top surface of the top layer of member 58 and are connected by conducting vias 62 to the windings 51 and 52.

Figure 4:
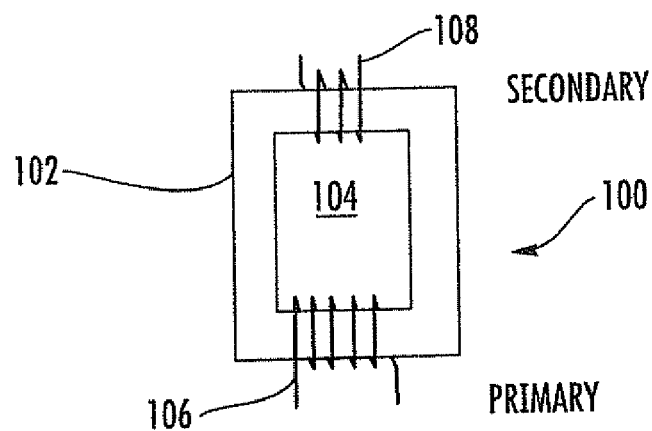
FIG. 4 is a plan view of a transformer in accordance with one non-limiting example of the present invention.
Figure 9:
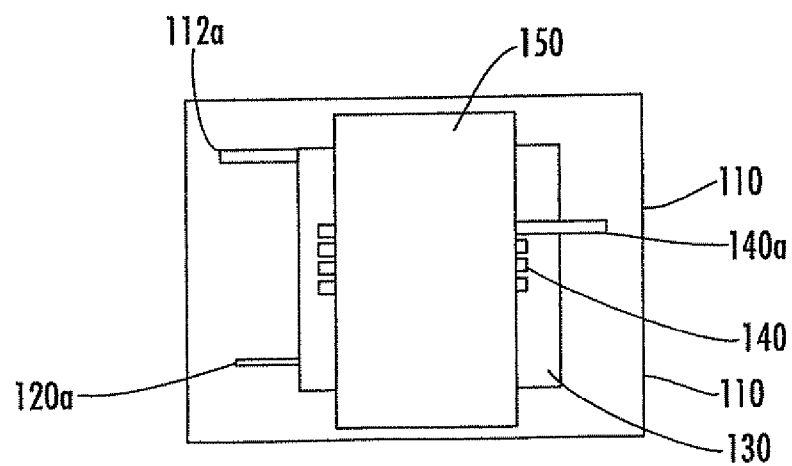
Figure 10:
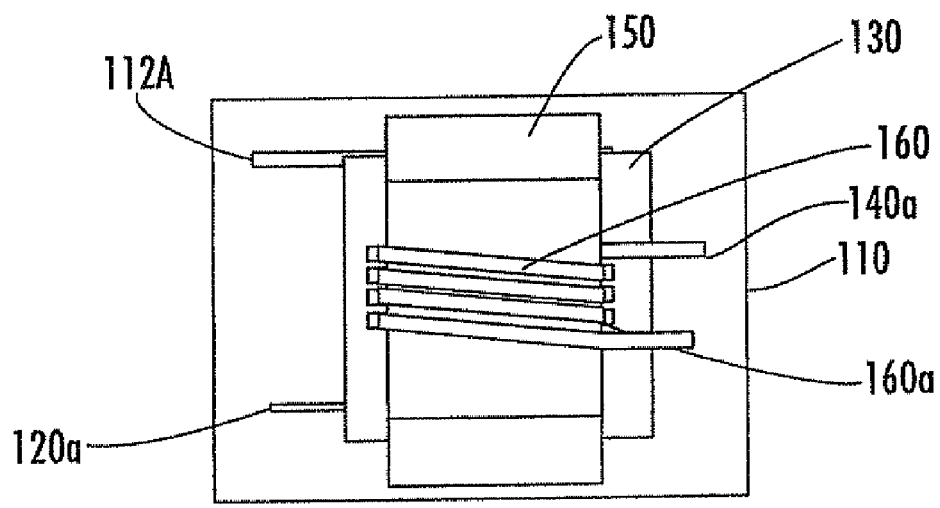
Figure 11:
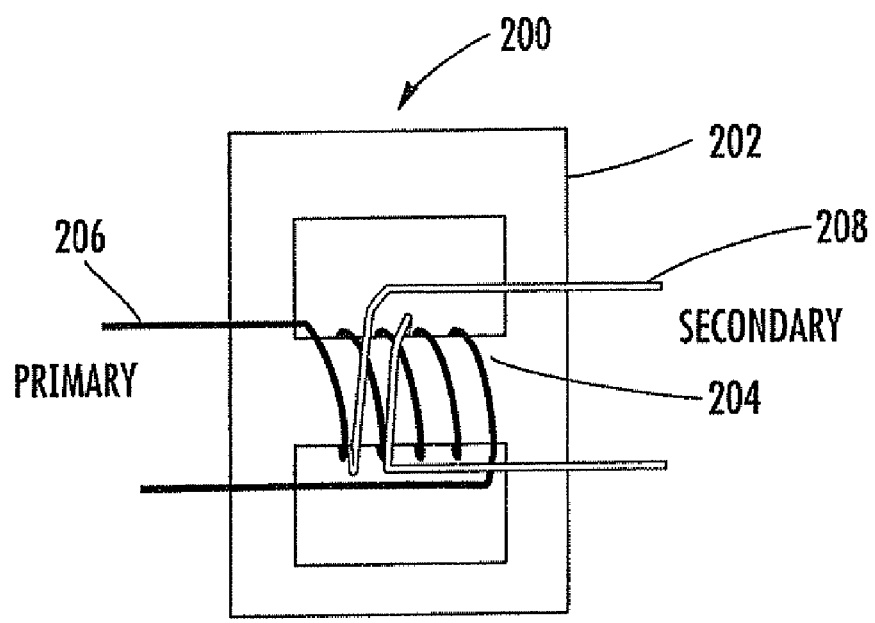
FIG. 11 is a plan view of another example of a transformer in accordance with a non-limiting example of the present invention.

Two different transformer structures, in accordance with non-limiting examples of the present invention, are shown in FIGS. 4 and 11, showing primary and secondary windings on a common core. FIG. 4 illustrates a transformer at 100 and shows a rectangular configured core 102 having an open area 104. The steps used for manufacturing the transformer 100 shown in FIG. 4 are shown in FIGS. 5-10. Respective primary and secondary windings 106, 108 are illustrated.

Figure 5:
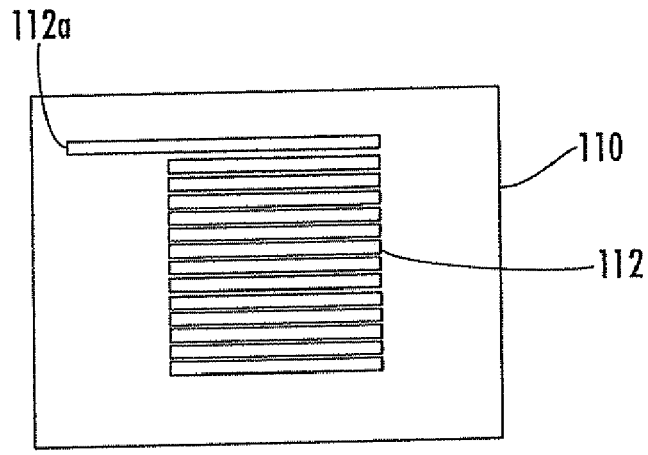
FIGS. 5-10 are plan view drawings showing a sequence of steps used for manufacturing the transformer shown in FIG. 4.

FIG. 5 is a plan view showing a substantially planar base 110 formed in this example as a substantially planar ceramic substrate for a fabrication sequence as a thick film substrate. A substantially planar configured, first half primary winding 112 is formed on the ceramic substrate 110. This winding can be typically formed by screen-printing a metallic conductor on the base 110, for example, a silver or gold screen-printed conductor. The base ceramic material could be an alumina type ceramic in one non-limiting example. As illustrated, an end 112 of the first halt primary winding 112 extends beyond the other coil ends, and is operative as one of the connection points, i.e., terminals for the completed transformer 100. Standard photolithography techniques can be used for printing the metallic conductors.

Figure 6:
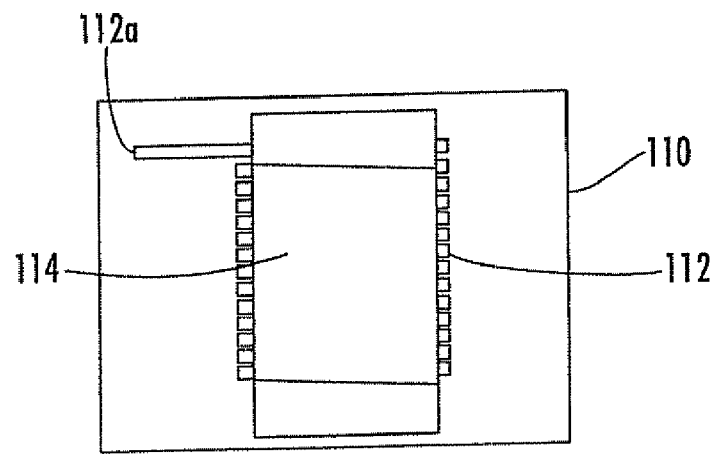

As shown in FIG. 6, a ferrite paste 114 is applied to the first half primary winding 112 and over the base, leaving the ends exposed. The ferrite paste 114 could be an inorganic paste, for example, a ceramic slurry that includes ferrite-ceramic particles and a binder as a non-limiting example. It can later be fired for enhanced density and performance. This could be a low temperature system or a high temperature system depending on end-use designs. It is also possible to use tungsten or molybdenum. It should be understood that it is not necessary to fire at this step, although it is possible to conduct one or multiple firings throughout the process.

Figure 7:
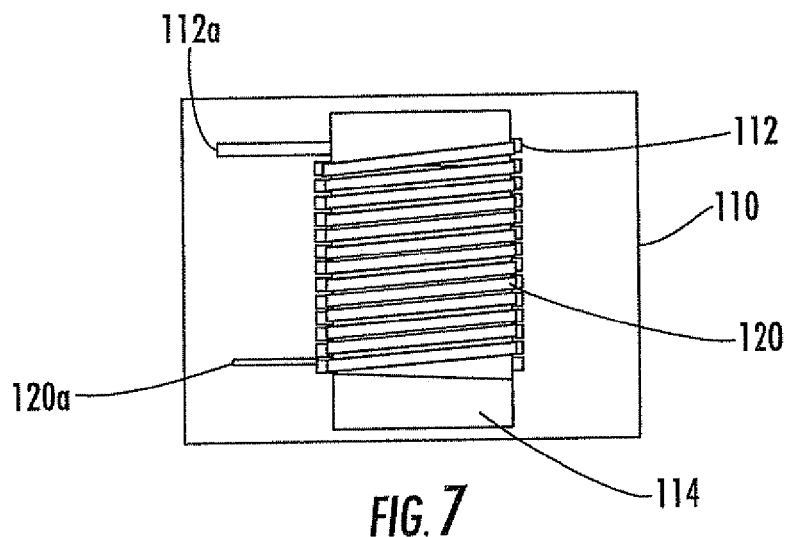

As shown in FIG. 7, the second half primary winding 120 is printed on the ferrite layer 114 such that the ends of this second half primary winding overlap the ferrite layer 114 and contact the exposed ends of the first half primary winding. One end 120a is longer and forms a terminal connection. Thus, the winding ends contact each other and form a completed transformer primary winding over the ferrite core formed by the ferrite paste 114. It is possible to overprint the ferrite such that no winding conductors formed from the first half primary winding are exposed. Vias can be formed in the pattern and either filled with a conductive paste or plated to form conductive vias. This could be possible if the ferrite paste is thick and it is difficult to overprint the second half primary winding such that winding ends would connect winding ends of the first half primary winding. Vias can be formed using a common thick film process, as described.

The line spacing can be about 2 to about 4 mils. The thick film process could be about one-half mil, e.g., about 12 microns, up to a thick film system norm of 2 to about 4 mils in non-limiting examples. It should be understood that it is also possible to use a green tape system and vias.

Figure 8:
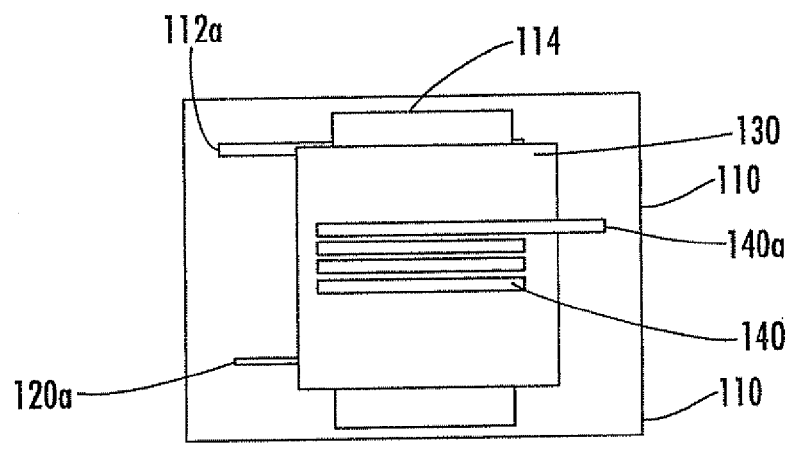

As shown in FIG. 8, a dielectric layer 130 can be deposited over the second half primary winding 120 as illustrated. This dielectric layer 130 could be a glass material and similar structure and forms a cavity corresponding to the cavity 104 shown in FIG. 4. It is also possible to use a material that burns-out and leaves a hole, as long as there is some structure left on which to print. The hole could be formed through evaporation in some manufacturing sequences.

As shown in FIG. 8, a first half secondary winding 140 is printed on the dielectric 130, and includes an end 140a that is operative as a terminal for the completed transformer. A second ferrite layer 150 is added as shown in FIG. 9, and the second half secondary winding 160 is printed on the ferrite layer 150 such that its ends connect to the ends of the first half secondary winding 140 as shown in FIG. 10. One end 160a is operative as a terminal for the completed transformer. Again, if the ferrite layer 150 is thick, the layer could be overprinted on the first half secondary winding 160. Conductive vias could be used to attach the first half secondary winding 140 and second half secondary winding 160. A coating or other layer could be applied subsequent to the step shown in FIG. 10 to aid in protecting the completed transformer structure.

A second example of a transformer, in accordance with non-limiting examples of the present invention, is shown in FIG. 11 and has fabrication sequence steps shown in FIGS. 12-15. This transformer design could be used for a mini S-band receiver operable at about 2.0 to about 4.0 GHz and designed to replace some commercial over-the-counter parts. The transformer is illustrated at 200 and includes a core 202 with a central portion 204 on which the primary and secondary transformer windings 206, 208 are wound.

Figure 12:
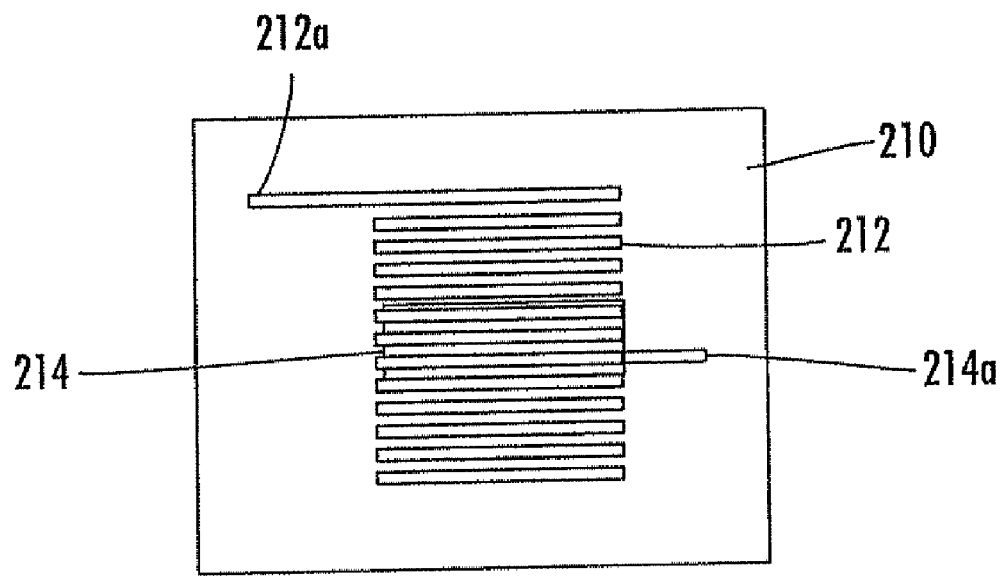
FIGS. 12-15 are plan views showing a sequence of steps used for manufacturing the transformer shown in the example of FIG. 11.
Figure 13:
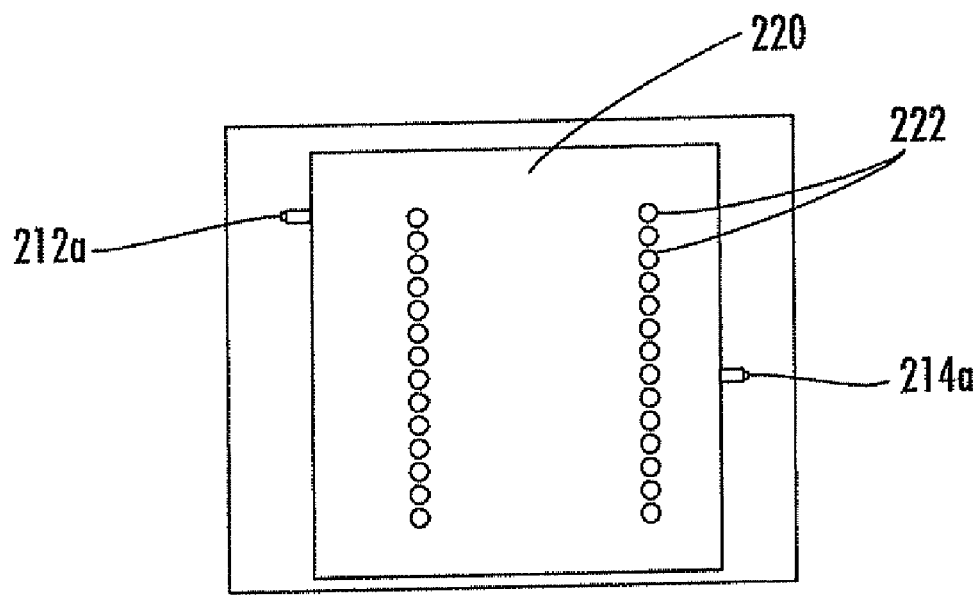
Figure 14:
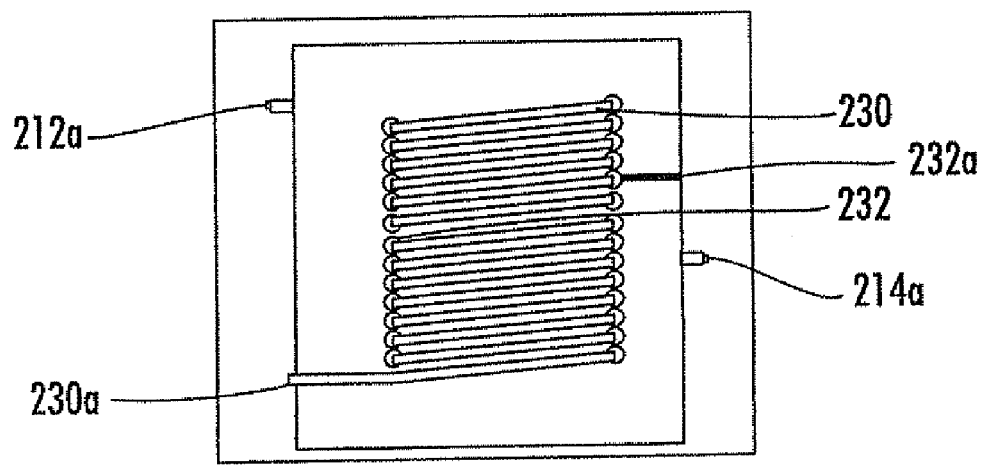
Figure 15:
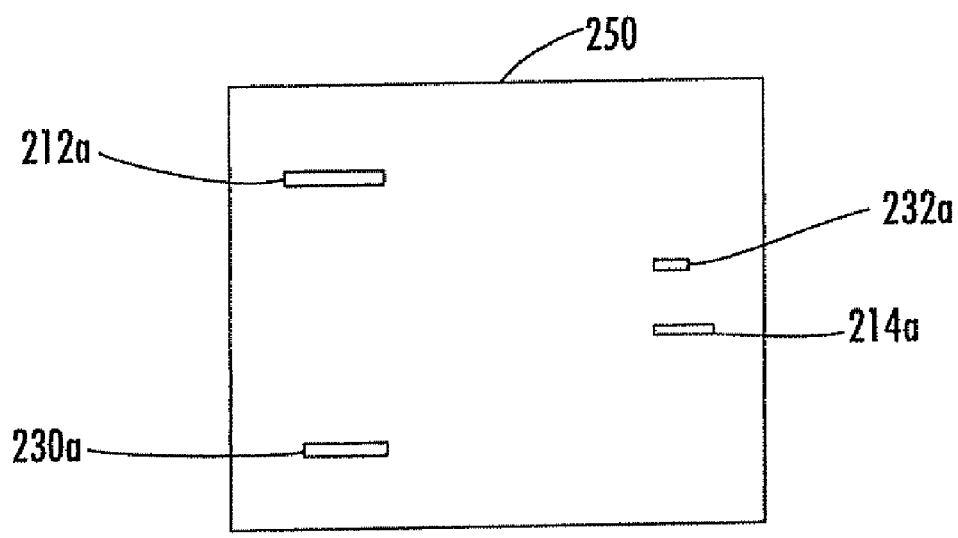

As shown in FIG. 12, a base layer 210 can be formed as a green tape layer, for example, an LTCC structure, e.g., an unfired ferrite tape in one non-limiting example. A first half primary winding 212 is printed together with the first half secondary winding 214 and spaced between the "turns" or printed first half primary winding conductors. The conductors are spaced from each other such that the conductive metallic lines forming the first half secondary winding 214 are spaced from any conductive metallic lines forming the first half primary winding 212. Ends 212a, 214a are exposed, forming terminals for the primary and secondary windings.

A ferrite layer 220 (FIG. 13) forms a "wrap core" and is applied over the first half primary winding 212 and first half secondary winding 214. This ferrite layer 220 has conductor vias 222 formed therein, which could be formed as plated through-holes or punched holes filled with a conductive fill.

As illustrated, a second half primary winding 230 and second half secondary winding 232 are printed on this ferrite "wrap core" 220 such that the winding ends connect to the conductive vias 222 and connect ends of the first half primary winding 212 and first half secondary winding 214. Longer ends of each winding 230, 232 form terminal ends 230a, 232a, as illustrated. A layer could be placed over the second half primary winding 230 and second half secondary winding 232 to leave only the ends exposed as illustrated in FIG. 5. This layer could be a ferrite layer 250.

It should be understood that any formed cavity is advantageous because the flux typically stays in the path of least reluctance. If some cavities are placed along edges lengthwise next to vias on the outside, it could improve the efficiency in some examples.

Figure 16:
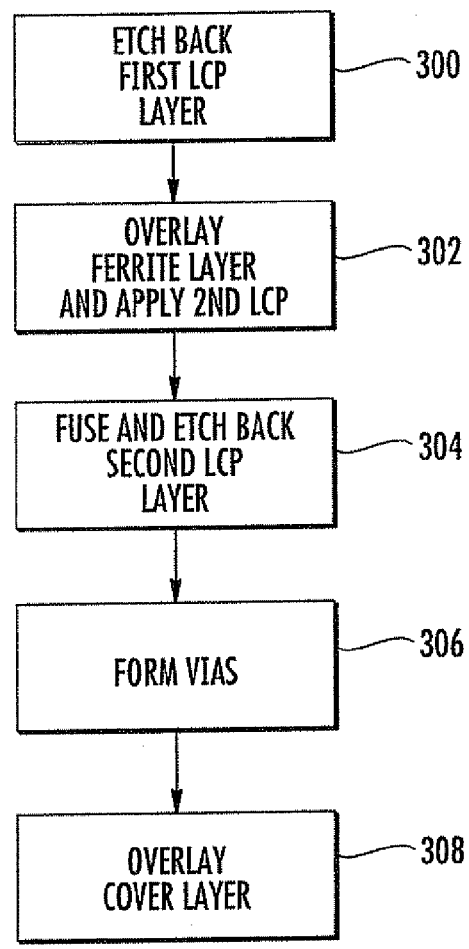
FIG. 16 is a flowchart illustrating an example of the steps used for manufacturing a transformer using liquid crystal polymer (LCP) sheets.

FIG. 16 shows a flowchart and illustrates a sequence of steps used for making a transformer structure similar to that shown in FIG. 11, using a liquid crystal polymer (LCP). The steps used for forming the transformer could be similar to those signs shown in FIGS. 12-15, but with a series of etching steps used instead. Typically, the liquid crystal polymer could be supplied in sheet form, in one non-limiting example, as a biaxially oriented film. It could include an orthogonal crystal structure as a biaxially oriented film. Ferrite fillers could be used to increase permeability and magnetic properties. The LCP sheets are preferably supplied as a laminate that includes a metallic cladding, for example, a copper cladding, which is etched to form a partial transformer structure similar to that shown in FIG. 12 with first half primary and secondary windings, followed by adding another LCP sheet and etching to form the second half primary and secondary windings.

As shown in the flowchart of FIG. 16, a first LCP layer can be etched back (block 300) to form the first half primary and secondary windings. A ferrite layer is applied (block 302) in one non-limiting example, and a second LCP layer applied and etched (block 304) to form the second half primary and secondary windings. The vias can be formed (block 306) and a cover layer overlaid (block 308). The LCP sheets can be fused together such as in autoclave.

Figure 17:
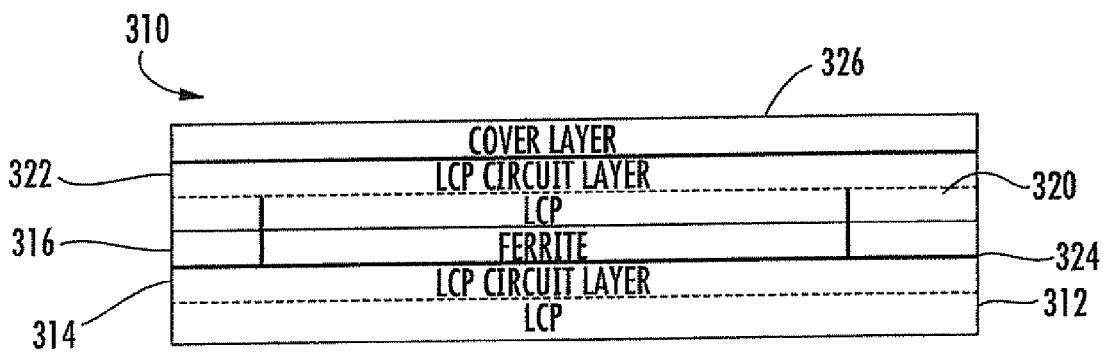
FIG. 17 is a sectional view of a transformer formed by using LCP sheets in accordance with the exemplary steps described in the flowchart of FIG. 16.

FIG. 17 is a sectional view of the different layers that can be used for forming the transformer using LCP'S. The transformer structure 310 includes a first LCP layer 312 that includes an etched back LCP circuit layer 314 forming the first half primary and secondary windings. A ferrite layer 316 is added and followed by a second LCP layer 320 that includes an etched back LCP circuit layer 322 for the second half primary and secondary windings. Vias 324 connect between the LCP circuit layers 314, 322 interconnecting primary windings to each other and secondary windings to each other. A cover layer 326 can be added over the second LCP layer 320. This layer could also have an LCP circuit layer adjacent the ferrite in some instances depending on the processing sequences used.

LCP has a unique property and can fuse to itself under pressure. An autoclave can be used to apply heat and pressure to allow the LCP sheets to fuse to themselves. A traditional prepeg process with plated through holes could also be used. Thus, it is possible to start with a sheet of LCP material that is loaded with ferrite for magnetic transformer properties and copper cladding, which is etched back. The first half primary and first half secondary windings can be formed and another LCP sheet applied, which is etched back to form the second half primary and second half secondary windings. When fully assembled, the vias can be drilled and plated or filled with conductive paste.

The liquid crystal polymer is typically formed as a thermoplastic polymer material and has rigid and flexible monomers that link to each other. The segments align to each other in the direction of shear flow. Even when the LCP is cooled below a melting temperature, this direction and structure of orientation continues. This is different from most thermoplastic polymers where molecules are randomly oriented in a solid state.

As a result, LCP has advantageous electrical, thermal, mechanical and chemical properties. It can be used for high-density printed circuit board (PCB) fabrication and semiconductor packaging. It can have a dielectric constant of about 3 in the range of about 0.5 to about 40 GHz and a low loss factor of about 0.004 and low moisture absorption and low moisture permeability.

LCP can be supplied as a thin film material ranging from about 25 micrometers to about 3 millimeters. One or both sides can include a copper cladding that is about 18 micrometers thick in some non-limiting examples, and could range even more. This copper cladding (layer) could be laminated in a vacuum press at around the melting point of LCP. Micromachining techniques could be used to allow MEMS applications. This could include photolithography, metallization, etching and electroplating. It is possible that some LCP material can be bonded to MEMS-related materials using a thermal bonding process and slight pressure at about the melting point or just below the melting point. Complex multilayer, three-dimensional structures could be formed.

This application is related to copending patent application entitled, "TRANSFORMER AND ASSOCIATED METHOD OF MAKING," which is filed on the same date and by the same assignee and inventors, the disclosures which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A transformer comprising:
a first liquid crystal polymer (LCP) sheet having opposing sides and a metallic cladding on at least one of the sides;
first half primary and secondary windings as metallic circuits and formed as a plurality of linear lines and etched on the metallic cladding such that secondary windings are positioned in spaced, substantially parallel relation to the primary windings;
a second LCP sheet having opposing sides and a metallic cladding on at least one of the sides and applied over the first LCP sheet;
second half primary and secondary windings as metallic circuits and formed as a plurality of linear lines parallel to each other etched on the metallic cladding of the second LCP sheet; and
conductive vias formed within first and second LCP sheets and interconnecting respective first and second half primary windings to each other and first and second half secondary windings to each other and forming a substantially rectangular configured transformer structure with primary and secondary windings on a common rectangular core having an open area.

2. A transformer according to claim 1, wherein said conductive vias are formed as plated through-holes.

3. A transformer according to claim 1, wherein said conductive vias are formed as punched holes that are filled with a conductive fill material.

4. A transformer according to claim 1, wherein said first and second LCP sheets comprise biaxially oriented LCP sheets.

5. A transformer according to claim 1, and further comprising a ferrite layer positioned between first and second LCP sheets.

6. A transformer according to claim 1, wherein said second LCP sheet is applied over the etched metallic circuit forming first half primary and secondary windings.

7. A transformer according to claim 1, wherein secondary windings are received between primary windings in spaced relation thereto.

8. A transformer according to claim 1, wherein said LCP sheets are between about 25 micrometers to about 3 millimeters thick.

9. A transformer according to claim 1, wherein said metallic cladding comprises a copper cladding.

* * * * *